(12) United States Patent
Harness et al.

(10) Patent No.: US 7,840,624 B2
(45) Date of Patent: Nov. 23, 2010

(54) DIGITAL LOW PASS FILTER

(75) Inventors: Jeffrey F. Harness, Hillsboro, OR (US); Warren Dean, Carlton, OR (US)

(73) Assignee: Intel Corporation, Santa Clara, CA (US)

( * ) Notice: Subject to any disclaimer, the term of this patent is extended or adjusted under 35 U.S.C. 154(b) by 2025 days.

(21) Appl. No.: 09/750,090

(22) Filed: Dec. 29, 2000

(65) Prior Publication Data

US 2002/0087606 A1 Jul. 4, 2002

(51) Int. Cl.
*G06F 17/10* (2006.01)

(52) U.S. Cl. .................................... 708/300

(58) Field of Classification Search ......... 708/300–323, 708/200; 714/701, 760, 822
See application file for complete search history.

(56) References Cited

U.S. PATENT DOCUMENTS

| 4,438,501 A | * | 3/1984 | Weber ........................ 708/250 |
| 5,034,744 A | * | 7/1991 | Obinata ...................... 341/118 |
| 5,053,647 A | * | 10/1991 | Shizukuishi et al. ........ 708/232 |
| 5,187,675 A | * | 2/1993 | Dent et al. .................. 708/207 |
| 5,481,568 A | * | 1/1996 | Yada .......................... 708/313 |
| 5,574,671 A | * | 11/1996 | Young et al. ................ 708/204 |
| 6,417,698 B1 | * | 7/2002 | Williams et al. ............. 326/93 |
| 6,535,023 B1 | * | 3/2003 | Williams et al. ............. 327/24 |
| 6,545,507 B1 | * | 4/2003 | Goller ......................... 326/93 |

OTHER PUBLICATIONS

Chih-Kong et al., A 0.5-um CMOS 4.0-Gbit/s Serial Link Transceiver with Data Recovery Using Oversampling, May 1998, IEEE Journal of solid-state circuits, vol. 33, No. 5, pp. 713-722.*

Ramin et al., A 0.3-um CMOS 8-Gb/s 4-PAM Serial Link Transceiver, May 2000, IEEE Journal of Solid-State Circuits, vol. 35, No. 5, pp. 757-764.*

* cited by examiner

*Primary Examiner*—Chat C Do
(74) *Attorney, Agent, or Firm*—Kenyon & Kenyon LLP

(57) ABSTRACT

Over-sampled data is filtered by receiving a word of over-sampled data including sample bits for each of a plurality of data bits, detecting a sample bit having one logic value and, on either side of it, bits having the opposite logic value and, upon such detection, outputting the received word with the sample bit having the one logic value inverted.

25 Claims, 5 Drawing Sheets

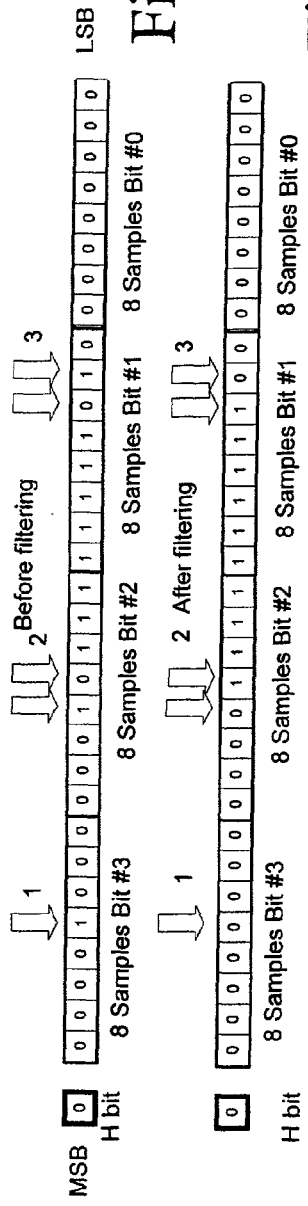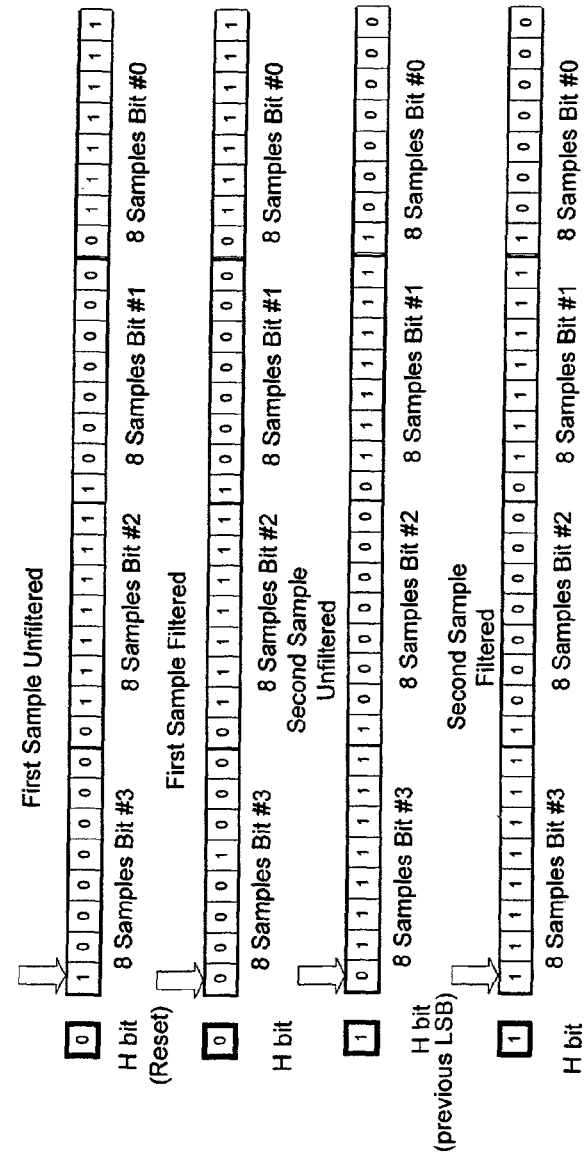

DIGITAL LOW PASS FILTER

FIELD OF THE INVENTION

Embodiments of the present invention relate to filtering over-sampled serial data.

BACKGROUND OF THE INVENTION

In some data communication arrangements, no separate clock signals are transmitted. This then requires recovering the clock at the receiving end in order to then recover the data. This can be characterized as the problem, in digital communications of, transferring digital signals between multiple clock timing domains. Multiple clock timing domains include the clock timing domain of a transmitting device as well as the clock timing domain of a receiving device. It is not unusual to transmit digital signals between clock timing domains having nearly the same underlying frequency clock, but different or varying phases with respect to each other.

One such arrangement is the Universal Serial Bus (USB). The USB is a bus having electrical, mechanical, and communication characteristics that follows a protocol defined in "Universal Serial Bus Specification" Revision 2.0 published Apr. 27, 2000, by Compaq Computer Corporation, Hewlett-Packard Company, Intel Corporation, Lucent Technologies Inc, Microsoft Corporation, NEC Corporation and Koninklijke Phillips Electronics N.V. The USB Specification provides a standardized approach for component interconnection and data transfer.

From the digital communications perspective, a USB transmitting device sends data in the form of packets over a USB cable to a USB receiving device with the clock signal of the transmitting device being used when encoding digital information. Packets include a defined sync field having multiple bits with a transition for each bit (i.e., from a logic 1 to a logic 0 or vis-versa), a payload with data information, and an end of packet field. As discussed below, the sync field with its transition for each bit, provides a rich set of edges for the USB receiver lock onto the phase and frequency of the USB transmitting device. The USB Specification does not allow for a separate clock signal to be transmitted and this makes it difficult for a USB receiving device to adequately recover the clock signal of the USB transmitting device.

The same problem of synchronization exists in other systems. One manner of dealing with that problem is described in "A 0.5-μm CMOS 4.0-Gbit/s Serial Link Transceiver with Data Recovery Using Oversampling," *IEEE Journal of Solid-State Circuits*, VOL. 33, No. 5, May 1998. A plurality of samples are taken over each bit time. The samples are used to determine exactly where bit transitions take place. This is done, for example, with decision logic utilizing exclusive OR gates to which adjacent samples are coupled. Once edges are detected, a phase picking algorithm is used to pick the center sample.

However, single sample glitches in the sampled data can make it difficult to accurately detect edges. If the edges can not be accurately detected, it becomes impossible to locate the center sample.

A need, therefore, exists for a technique of filtering the over-sampled data before it is fed to an edge detector to overcome the problem of single sample glitches.

BRIEF DESCRIPTION OF THE DRAWINGS

FIGS. 2a-2f are bit pattern diagrams helpful in understanding how embodiments of the present invention eliminate glitches in over-sampled data.

DETAILED DESCRIPTION

Embodiments of methods and systems for digitally filtering are described. In the following description, for purposes of explanation, numerous specific details are set forth to provide a thorough understanding of the present invention. It will be appreciated, however, by one skilled in the art, that the present invention may be practiced without these specific details. In other instances, structures and devices are shown in block diagram form. Furthermore, one skilled in the art can readily appreciate that the specific sequence in which methods are presented and performed are illustrative and it is contemplated that the sequences can be varied and still remain within the spirit and scope of the present invention.

Figure 1:
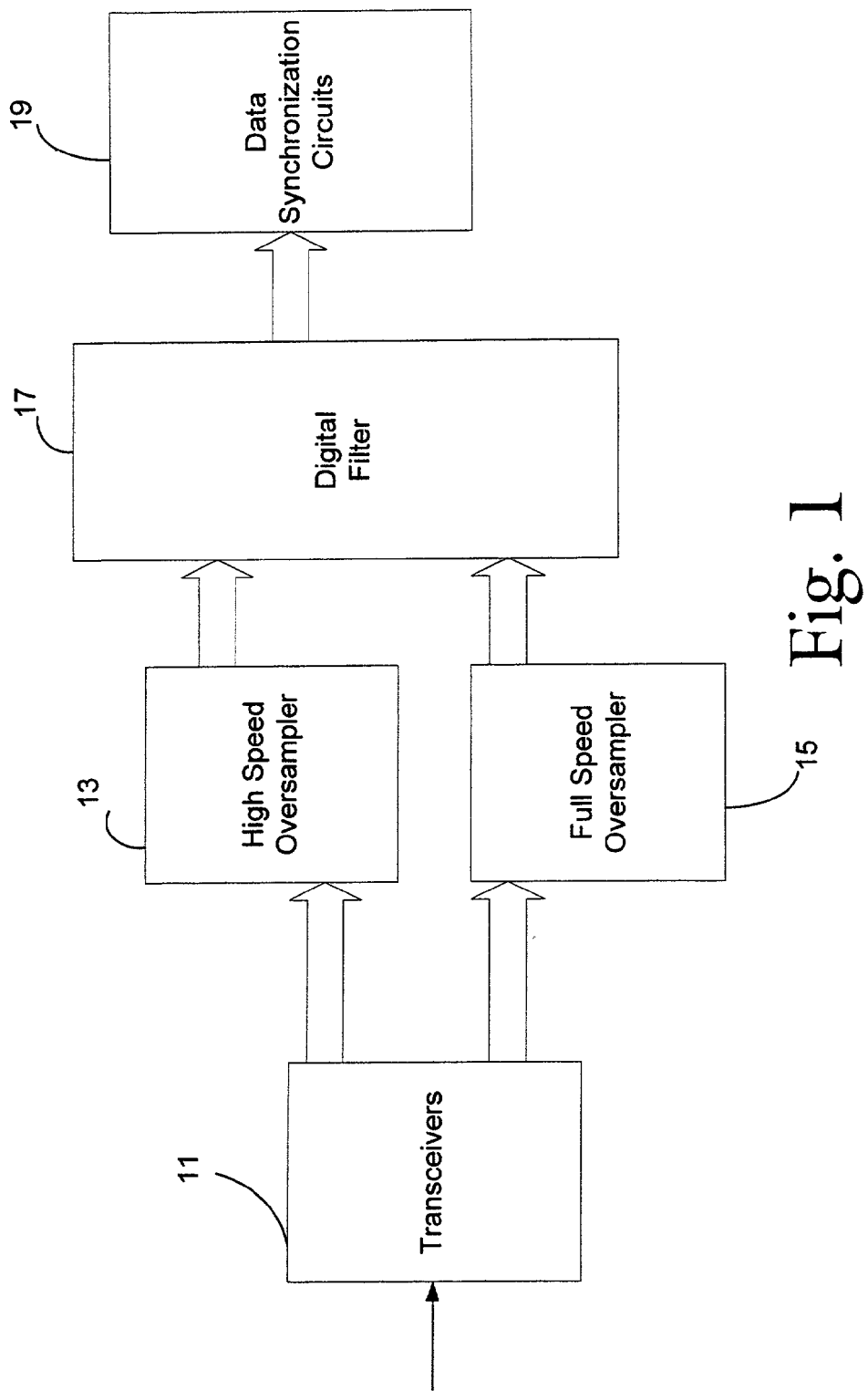
FIG. 1 is a block diagram of an example of a system in which embodiments of the digital filter of the present invention may be used.

FIG. 1 is a block diagram of a receiver 10 for receiving digital data signals in which an embodiment of the present invention can be utilized. As an example, the receiver may comprise a Universal Serial Bus (USB) receiver. However, the method and apparatus of the present invention is applicable to data receivers in which synchronization for data recovery must be performed, in general. As discussed above, in USB signaling, there is no separate clock signal sent over USB cable. There are no unique symbols reserved for start of packet delimiting. Data is sent at a frequency of 480 Mb/s with a tolerance of +/−500 parts per million (ppm).

The receiver of FIG. 1 includes transceivers 11 that receive the incoming serial data. Data is provided from the transceivers to, in the illustrated embodiment, a high-speed over-sampler 13 and a fall speed over-sampler 15. Two over-samplers are by no means required. In fact any source of over-sampled data may be used. In the over-samplers 13 and 15, for each bit time, a number of samples, for example, 8 samples, are taken. Over-sampling at 8 samples for each bit time is used as an example herein. It should be recognized that other numbers of over-samples per bit time may equally well be used. The over-samplers 13 and 15 outputs data for a plurality of a bit times. In the example shown, a 32 bit word is output, representing eight samples for each of 4 bits. The respective 32 bit outputs from the over-samplers 13 and 15 are provided to a digital filter 17 constructed in accordance with an embodiment of the present invention. Digital filter 17 selects between the two inputs, filters the input and outputs a filtered 32 bit word to data synchronization circuits 19. These circuits utilize the filtered sample data to synchronize the incoming data with the local clock.

Figure 3:
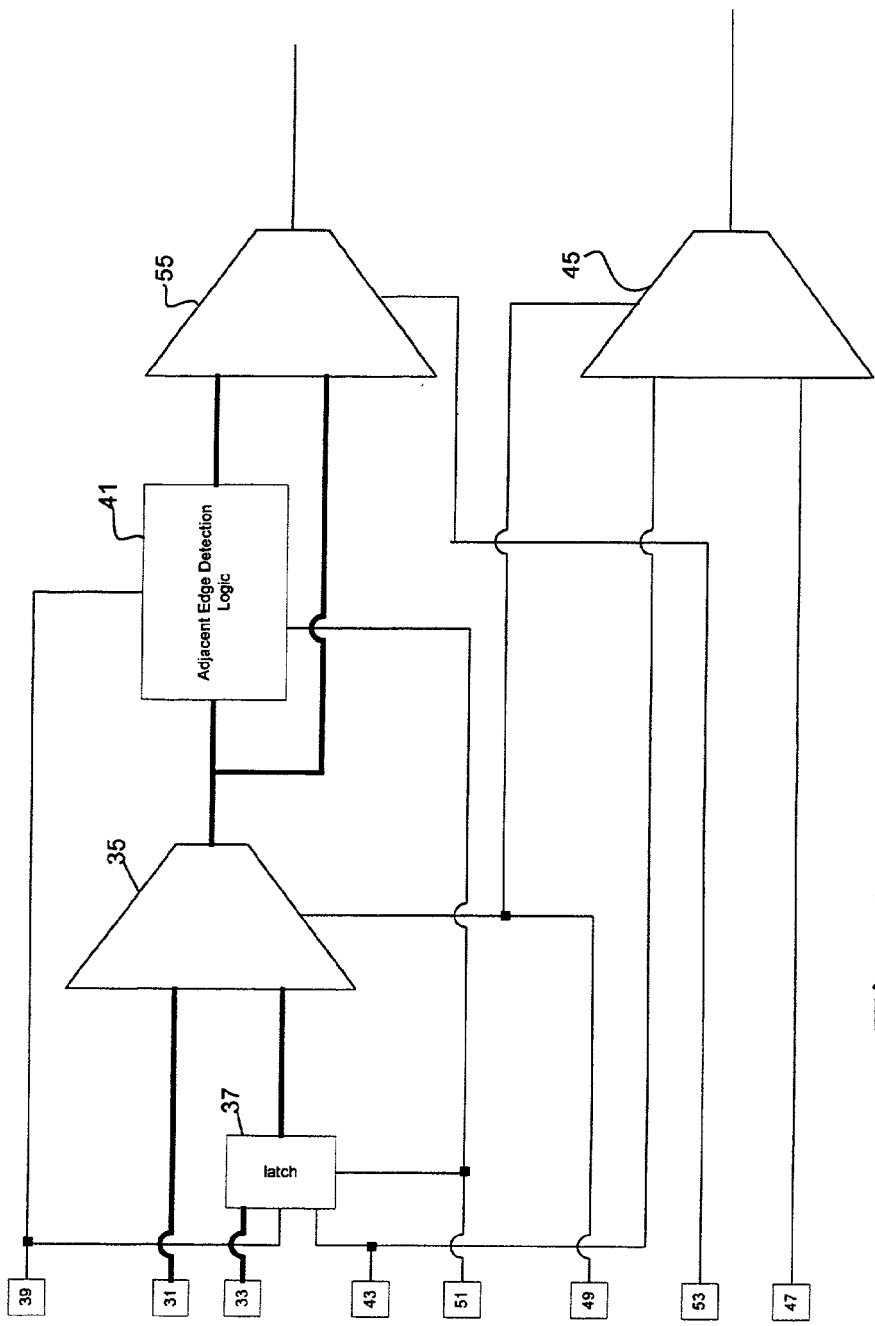
FIG. 3 is a block/logic diagram of an embodiment of an digital filter according to present invention.

The manner which this selection between over-sampler 13 and over-sampler 15 is done is illustrated in FIG. 3. Data from high-speed over-sampler 13 comes in on terminal 31 and data from the full speed over-sampler on terminal 33. Terminal 31 is coupled to one input of a multiplexer 35. The second input the multiplexer 35 is from a D-type flip flop 37 which has as its data input the full speed data from terminal 33. In this manner it supplies latched data to multiplexer 35. The clock input on terminal 39 provides a clock to the flip flop 37 and to the edge detection logic 41 which will be explained below in connection with FIG. 4.

The flip-flop 37 also has an enable input coupled to terminal 43. This is enabled by a signal indicating that full speed data is valid. This line also provides an input to a multiplexer 45 which has an output line indicating that the data from the low pass filter is valid. The second input to multiplexer 45 is from a terminal 47 which indicates that high-speed data is valid. Multiplexer selection for multiplexer 45 is controlled by an input from terminal 49 which is used to indicate whether the system is in the high-speed or full speed mode. This input on terminal 49 also controls the selection of multiplexer 35 of either high speed data or full speed data.

The output of multiplexer 35 is fed to adjacent edge detection logic 41 and to a bypass multiplexer having the output of logic 41 as its second input. Remaining input terminals include a terminal 51 which is a reset terminal for the edge detection logic 41 and flip-flop 37. The final terminal 53 provides an enable signal to select operation of the edge detection logic 41 or bypass, by controlling multiplexer 55.

If the operation mode signal on terminal 49 indicates that the operation mode is for the full speed over-sampler, multiplexer 45 and a data multiplexer 35 are both set to select the full speed input. Thus, the full speed data valid signal on terminal 43 is coupled to the output of multiplexer 45. Similarly, the full speed data 33 is coupled through the flip flop 31 to the multiplexer 35 and output as the output data to the edge detection logic 41. If the operation mode indicates use of the high-speed over-sampler, then the input from terminal 31 will be selected and appear at the output of multiplexer 35. Similarly, multiplexer 45 will output whatever signal is on high-speed data valid input terminal 47.

The signal on line 51 determines whether the filtered output from logic 41 is to be used or not. When filtering is enabled, the input to multiplexer 55 from logic 41 is enabled. Otherwise, the adjacent edge detection logic is bypassed and the output of multiplexer 35 is selected and appears at the output of multiplexer 55.

FIGS. 2a-2f show 32 bit sample patterns before and after filtering. In this data, a data transition is considered to be the case when two adjacent bits do not have the same value. This is, the subsequent circuitry determines where the bit boundaries are based on this change. Turning to FIG. 2 b, which is the filtered signal, it can be seen that a transition occurs after the second sample in bit #1 and again after be forth sample in bit #2. These are the places where a transition from 0 to 1 or 1 to 0 takes place. And, it is these transitions which are utilized subsequently to determine the bit boundaries. The problem is, that if glitches occur, these determinations can not be made. A sample pattern containing glitches is illustrated in FIG. 2 a. The numbered downward pointing arrows indicate the glitch locations. Thus at glitch 1, the fourth sample for bit #3 is a 1 instead of a 0. At glitch 2, there are two errors. Sample 4 of bit 2 should be a 1 but it is a 0. Sample 5 should be a 0 and it is a 1. Similarly, at glitch 3, two samples are wrong. As indicated in FIG. 2b, these errors are corrected by embodiments of the digital filter of the present invention.

In addition to the 32-bit over-sampled data structure found in the figures, an additional storage bit is edited to provide one sample time of history. This is indicated on FIGS. 2a-2f as H bit or history bit. The way in this bit is used is explained in detail below in connection with an explanation of the operation of FIG. 4.

Figure 4:
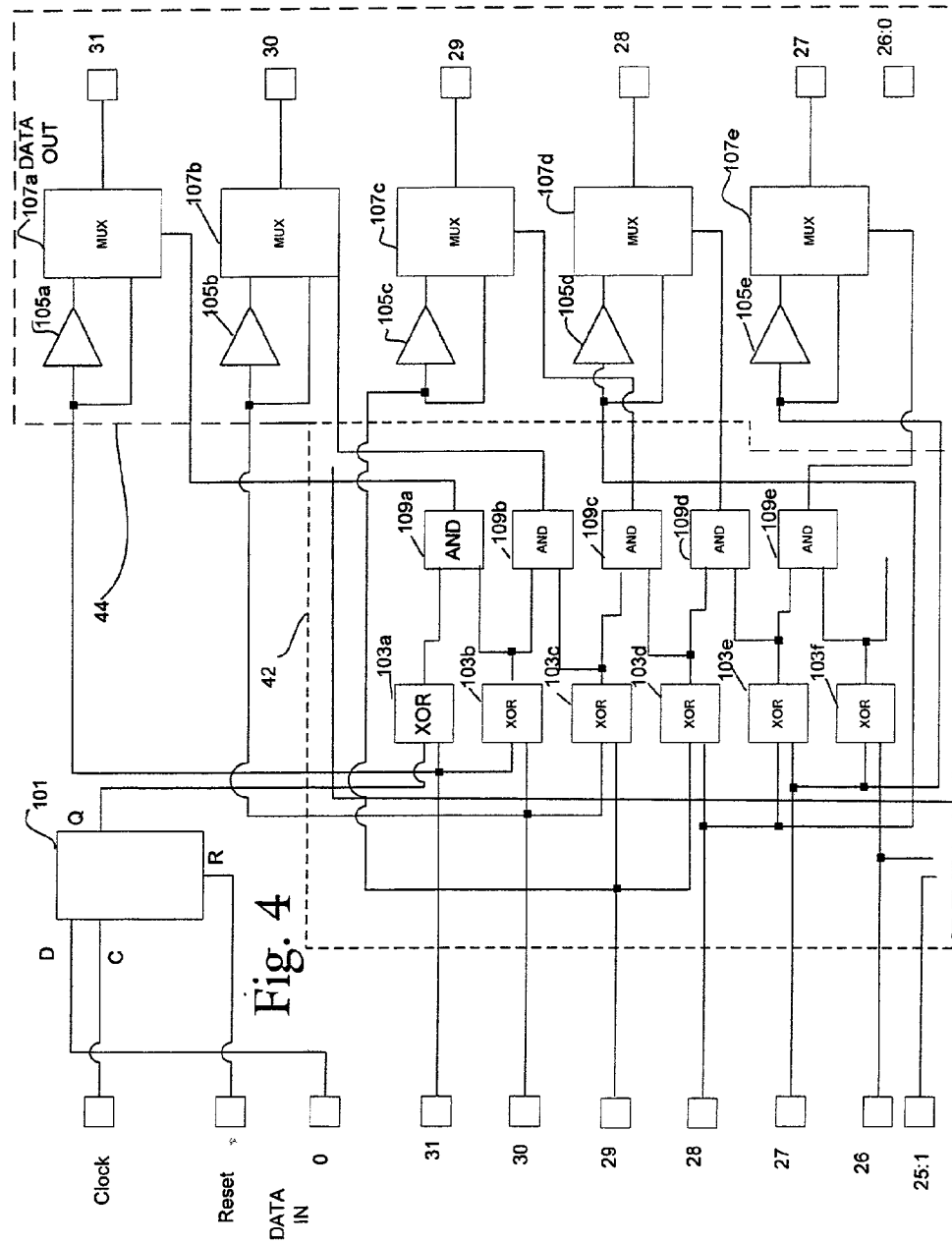
FIG. 4 is a block/logic diagram of an embodiment of edge detection logic which can be used in the embodiment of FIG. 3.

FIG. 4 is a logic diagram of an embodiment of the edge detection logic 41 of the present invention. In general terms, the edge detection logic 41 includes detection logic 42 coupled to receive a word of over-sampled data including sample bits for each of a plurality of data bits and to detect a sample bit having one logic value and on either side of it, bits having the opposite logic value, and an output circuit 44 outputting the received word with the sample bit having said one logic value inverted. The detection logic 42 includes a plurality of exclusive OR gates 103, a plurality of And gates 109 and a D-type flip-flop 101, the interconnection of which will be explained below. The output circuit 44 includes a plurality of multiplexers 107 and a plurality of inverters 105, one for each sample bit. The interconnection and operation of these will also be explained in detail below.

More specifically, in the illustrated embodiment, data comes in to a plurality of 32 data terminals. Only the terminals 26:31 and their connections are found in the drawing. It will be recognized that the illustrated arrangement will be duplicated for the remaining data bits. Also shown is data bit 0 which is used to obtain the history bit. It is coupled to the data input of a D-type flip flop 101. The output of the D-type flip flop 101 is the H bit. Turning to FIG. 2c, initially a signal on the reset terminal resets flip flop 101 to thereby reset the H bit. Consider the case where the remaining samples are as shown in FIG. 2c. A glitch is illustrated as being present at the last bit, that is bit 31. This is true both in the first sample set of FIG. 2c and the second sample set of FIG. 2d. Each of the samples is fed as one input to an exclusive OR gate 103. The second input to each exclusive OR gate is from the adjacent higher bit. Thus, exclusive OR gate 103b has as one input sample 30 and as its second input sample 31. On the other hand, exclusive OR gate 103 a has as its second input the output of flip flop 101, since it is the highest order sample. Each of the sample inputs is also fed to an inverter 105 and a multiplexer 107. Thus, sample 31 is fed to inverter 105a and multiplexer 107a, The output of the inverter provides a second input to the multiplexer. The multiplexer output is the filtered output for that particular sample. Thus, the output of multiplexer 107a is the sample 31 output. This arrangement is repeated all the way down to sample 0 although only the outputs down to sample 27 are illustrated in FIG. 4.

Multiplexer selection is controlled by the output of AND gates, one being provided for each multiplexer. Thus multiplexer 107a is controlled by AND gate 109a. AND gate 109a has as its two inputs the respective outputs of exclusive OR gates 103a and 103b. Similarly AND gate 109b provides control for multiplexer 107b. It receives inputs from exclusive OR gate 103b and exclusive OR gate 103c. In the example of FIG. 2c, the input to exclusive OR gate 103a from flip flop 101 will be a 0 and the input from sample 31 will be a 1. The first input to exclusive OR gate 103b will thus be a 1 from sample 31. The second input will be a 0 from sample 30. Thus its output will also be a one and the inverted input to the multiplexer 107a will be selected. As result, bit 31 will be inverted as is apparent from FIG. 2d.

On the other hand, exclusive OR gate 103c, which has as inputs samples 29 and 30 will have two 0s at its inputs and a 0 at its output. As result, AND gate 109b will not be enabled and will have a 0 at its output. Thus, the un-inverted input to multiplexer 107b will be selected. The similar result occurs for the remaining samples. When the second sample is received, the least significant bit of the first sample will have been clocked into flip flop 101. Thus, for the second sample, the H bit is now 1. As shown in FIG. 2e, a glitch has occurred in the most significant bit, bit 31. It is a 0 when it should be a 1. Exclusive OR gate 103a will have only one 1 as an input and thus will have and output of 1. Similarly, exclusive OR gate 103b, will have a 1 input and 0 input and thus it will have a 1 output enabling AND gate 109a to cause the multiplexer 107a to switch to the inverted input. Thus, as shown in FIG. 2f, the glitch at sample 31 will be corrected. Again, for the rest of the bits, their respective AND gates will not be enabled and the respective multiplexers will select the un-inverted input.

In the illustrated embodiment, exclusive OR gates and AND gates are employed. It will be recognized that any logic which performs the necessary exclusive ORing function and ANDing function can be used. For example, the AND gates could be replaced with NOR gates. Other combinations of gates, multiplexer control and inversion of the proper bits will be evident to those skilled in the art.

It is apparent that with the logic utilized in FIG. 4, whenever a glitch occurs, there will be a sample bit having one logic value and on either side of it, bits having the opposite logic value. What this means is that, when at least three bits are provided as inputs to two adjacent exclusive OR gates, the two exclusive OR gates will each have an output to enable the AND gate to which they are connected to select the inverted input to the associated multiplexer and invert the bit which has the improper value.

More generally, embodiments of the present provide a method of filtering over-sampled data in which a word of over-sampled data for a plurality of data bits (in the example four bits) is received. A received sample bit having one logic value and having, on either side of the bit having one logic value, bits having the opposite logic value are detected. When this occurs, there is a glitch. Upon such detection the received word is output with the sample bit with the one logic value inverted. The detection is done in the illustrated embodiment by exclusively ORing each sample bit in the word separately with the next highest and next lowest bits and detecting when outputs result from both exclusive ORing operations. This is done in the illustrated embodiment by ANDing the results of the exclusive ORing.

In typical embodiments, the word will come from an over-sampler, although this is not required. In the illustrated embodiment two over-samplers are present and selection is made before receiving a word in which glitches are to be detected. As noted above, in other cases a single over sampler could be provided.

Figure 5:
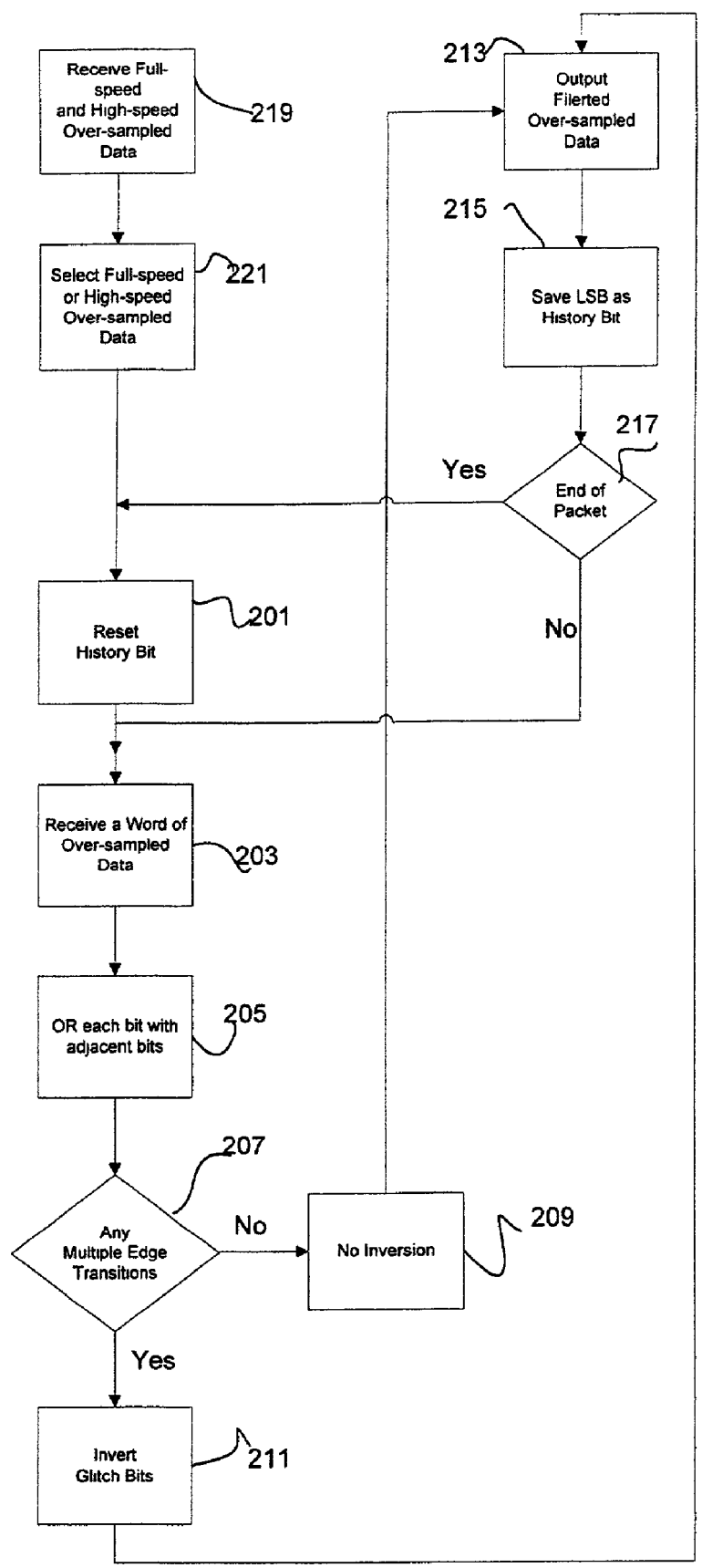
FIG. 5 is a flow diagram of a method of elimination glitches according to an embodiment of the present invention.

FIG. 5 is a flow diagram of embodiment of the method according to the present invention. The first step of the method itself is step 201 resetting the history bit. The next step 203 is receiving a word of over-sampled data. After a word of data is received, each bit is exclusively ORed with adjacent bits as indicated and block 205. This includes using the history bit as the higher adjacent bit for the most significant bit of the word. From this, multiple edge transitions are detected as indicated in block 207. In the illustrated embodiment, this happens when two adjacent exclusive OR operations each have an output. As indicated above, this can be determined by ANDing the results of the exclusive OR operations. If there is no multiple edge transition then the bits are output as received without inversion as indicated by block 209. On the other hand, if multiple edge transitions about a bit are detected, this indicates a glitch bit. Glitch bits are inverted before the word is output as indicated by block 211.

The outputs of blocks 211 and 209 are inputs to block 213 which represents the steps of outputting the word. Then the LSB is saved as the history bit as indicated by block 215. After this a check is made to see if it is the end of the packet. If so, the history bit is reset and the system waits for the next packet. Otherwise it returns to block 203 to receive another word of data. In conformance to the embodiments of FIG. 1 and FIG. 3, the optional preliminary steps 203 of receiving both full speed and high-speed over-sampled data and step 205 of selecting between those two is illustrated also.

Although a hardware implementation of this method has been illustrated, it may also be carried out using a processor and associated memory where a program for executing embodiments of the method are stored. In this case digital filter 17 will comprise a programmed digital processor with memory. In such a case, a computer readable memory containing program instructions that, when executed by the processor, cause the processor to execute steps, such as those of the embodiment of FIG. 5 will be provided Embodiments of methods and apparatus for digital filtering have been described. In the foregoing description, for purposes of explanation, numerous specific details are set forth to provide a thorough understanding of the present invention. It will be appreciated, however, by one skilled in the art that the present invention may be practiced without these specific details. In other instances, structures and devices are shown in block diagram form. Furthermore, one skilled in the art can readily appreciate that the specific sequences in which methods are presented and performed are illustrative and it is contemplated that the sequences can be varied and still remain within the spirit and scope of the present invention.

In the foregoing detailed description, apparatus and methods in accordance with embodiments of the present invention have been described with reference to specific exemplary embodiments. Accordingly, the present specification and figures are to be regarded as illustrative rather than restrictive.

What is claimed is:

1. A method of filtering over-sampled data comprising:
   a. receiving a word of over-sampled data including a plurality of sample bits for each of a plurality of data bits;
   b. detecting a sample bit having one logic value and adjacent bits on both sides of said sample bit each having an opposite logic value to the one logic value of said sample bit; and
   c. outputting the received word with the sample bit having said one logic value inverted.

2. The method according to claim 1 further comprising over-sampling said data and receiving said word from at least one over-sampler.

3. The method according to claim 2 and further comprising selecting a word to be received from between two over-samplers.

4. The method according to claim 1 wherein said over-sampled data is USB 2.0 data.

5. A method of filtering over-sampled data comprising:
   a. receiving a word of over-sampled data including a plurality of sample bits for each of a plurality of data bits;
   b. detecting a sample bit having one logic value and, on either side of it, bits having an opposite logic value wherein said detecting comprises:
   b1. exclusively ORing each sample bit in said word separately with each bit on either side of the sample bit; and
   b2. ANDing the results of said exclusive ORing; and
   c. outputting the received word with the sample bit having said one logic value inverted.

6. The method of claim 5 and further including providing a history bit to supply a bit to be exclusively ORed with the most significant bit of said word.

7. The method according to claim 6 wherein a plurality of words in succession are received, with the operations a, b, and c performed for each word, and further including saving the least significant bit of a last previous word received as the history bit for the next word received.

8. The method according to claim 7 comprising receiving words until the end of a packet is reached.

9. The method of claim 5 wherein said outputting comprises outputting each of said sample bits uninverted if the result of said ANDing is one logic level and inverted if the result is the other logic level.

10. Apparatus for filtering over-sampled data comprising:
  a. detection logic coupled to receive a word of over-sampled data including a plurality of sample bits for each of a plurality of data bits and to detect a sample bit having one logic value and adjacent bits on both sides of said sample bit each having an opposite logic value to the one logic value of said sample bit; and
  b. an output circuit outputting the received word with the sample bit having said one logic value inverted.

11. Apparatus for filtering over-sampled data comprising:
  a. detection logic coupled to receive a word of over-sampled data including a plurality of sample bits for each of a plurality of data bits and to detect a sample bit having one logic value and on either side of it, bits having an opposite logic value, said detection logic further comprises
    a1. a plurality of terminals for receiving said sample bits for each of a plurality of data bits;
    a2. a plurality of first two input logic circuits to perform an exclusive OR function, each having its inputs coupled to two adjacent terminals; and
    a3. a plurality of second two input logic circuits to perform an AND function, each having as inputs outputs of two adjacent first logic circuits
  b. an output circuit outputting the received word with the sample bit having said one logic value inverted.

12. The apparatus of claim 11 and further including a storage element to store a history bit, an output of said storage element coupled to one of said first logic circuits having as a second input a sample bit which is most significant.

13. The apparatus of claim 12 wherein said output circuit comprises:
  a. a plurality of inverters, one coupled to each terminal; and
  b. a plurality of multiplexers, each having a first data input coupled to an output of one of said inverters, an second data input coupled to the corresponding terminal, and a control input coupled to the output of the one of said second logic circuits associated with said terminal and an output.

14. The apparatus of claim 13 wherein a plurality of words in succession are to be received, said storage element having an input coupled to the least significant sample bit and having a clock input to clock said input to its output prior to receiving a new word.

15. The apparatus of claim 14 and further comprising an over-sampler to supply said words to said terminals.

16. The apparatus of claim 15 wherein two over-samplers are provided and further including a selection circuit to select between two over-samplers.

17. The apparatus of claim 16 wherein said selection circuit is a multiplexer.

18. The apparatus of claim 13 wherein said over-sampled data is USB 2.0.

19. A computer readable memory containing program instructions that, when executed by a processor, cause the processor to:
  a. receive a word of over-sampled data including a plurality sample bits for each of a plurality of data bits;
  b. detect a sample bit having one logic value and adjacent bits on both sides of said sample bit each having an opposite logic value to the one logic value of said sample bit; and
  c. output the received word with the sample bit having said one logic value inverted.

20. A computer readable memory containing program instructions that, when executed by a processor, cause the processor to:
  a. receive a word of over-sampled data including a plurality sample bits for each of a plurality of data bits;
  b. detect a sample bit having one logic value and, on either side of it, bits having an opposite logic value
  c. exclusively OR each sample bit in said word separately with each of the bits on either side of the sample bit; and
  d. AND the results of said exclusive ORing; and
  e. output the received word with the sample bit having said one logic value inverted.

21. A computer readable memory according to claim 20 wherein said processor is caused to provide a history bit to supply a bit for exclusive ORing with the most significant bit of said word.

22. A computer readable memory according to claim 21 wherein said processor is caused to receive a plurality of words in succession, with the operations a.-e. performed for each word and said processor is further caused to save the least significant bit of a last previous word received as the history bit for the next word received.

23. A computer readable memory according to claim 22 wherein said processor is caused to receive words until the end of a packet is reached.

24. A computer readable memory according to claim 23 wherein said processor is caused to output said each sample bits uninverted if the result of said ANDing is one logic level and inverted if the result is the other logic level.

25. A computer readable memory according to claim 21 wherein said over-sampled data is USB 2.0 data.

* * * * *